May 7, 1957 T. F. GOSSARD 2,791,124

FINE TUNING UNIT

Filed Dec. 13, 1951 4 Sheets-Sheet 1

INVENTOR.
THOMAS FISHER GOSSARD

BY Ostrolenk & Faber

ATTORNEYS

May 7, 1957 T. F. GOSSARD 2,791,124

FINE TUNING UNIT

Filed Dec. 13, 1951 4 Sheets-Sheet 2

INVENTOR.
THOMAS FISHER GOSSARD

BY Ostrolenk & Faber

ATTORNEYS

INVENTOR.
THOMAS FISHER GOSSARD

BY Ostrolenk & Faber

ATTORNEYS

May 7, 1957 T. F. GOSSARD 2,791,124

FINE TUNING UNIT

Filed Dec. 13, 1951 4 Sheets-Sheet 4

Inventor
THOMAS FISHER GOSSARD

By Ostrolenk & Faber

Attorneys

United States Patent Office 2,791,124

Patented May 7, 1957

2,791,124

FINE TUNING UNIT

Thomas Fisher Gossard, North Hollywood, Calif., assignor to Standard Coil Products Co., Inc., Los Angeles, Calif., a corporation of Illinois Application December 13, 1951, Serial No. 261,418

2 Claims. (Cl. 74—206)

This invention is a continuation in part of application 226,718, filed May 16, 1951, now Patent No. 2,658,394, issued November 10, 1953, and relates to television frequency selectors of the type now known generally as television tuners and is directed more particularly to the arrangement of the fine or vernier tuning elements of the local oscillator structure, and may also be applied to the fine tuning and matching of the type of pre-amplifier which is become to be known as a television booster.

In frequency selectors of the television tuner type, a step by step tuning arrangement is provided operated by a rotatable shaft to move successively a plurality of inductors into engagement with contact elements in order to tune the unit to the different television channels. As disclosed in prior application Serial Number 218,162, filed March 29, 1951, now Patent No. 2,650,298, issued August 25, 1953, a fine or vernier tuning arrangement is also provided. It has long been desirable to make the fine tuning knob on the tuner co-axial with the tuner channel selector.

However, in modern television tuners and even boosters, it is often necessary owing to the desired compactness of design and the placement of associated components to mount the fine tuning condenser in a position axially displaced from the main axis of rotation of the channel selector.

An important object of the present invention is the provision of a single inexpensive operating device for the fine tuning elements of a television tuner where the fine tuner is axially displaced from the main channel selector but wherein nevertheless the fine tuner control could be co-axial with the channel selector control.

To accomplish this object, my invention contemplates in one of the modifications thereof, mounting a rotatable sleeve on the shaft of the principal channel selector and utilizing a shaft parallel to the channel selector shaft to operate the fine tuner. The latter shaft is bent into an arcuate shape at one end which in turn is bent at right angles to the fine tuner operating shaft and is placed in frictional relation with an appropriate portion of the sleeve on the main shaft. Rotation of the sleeve therefore results in rotation of the fine tuning shaft, the turn ratio being determined by the radius of curvature of the arcuate bend of the fine tuner shaft as compared with the radius of the sleeve. Consequently, with a fine tuner which rotates a maximum of 90°, the sleeve may be rotated as much as 270° or even more so that delicate adjustment is possible. Possible slippage offers no obstacle, since fine tuning is adjusted subjectively by aural and visual results rather than by calibration.

Moreover, rotation of the main shaft by a direct linkage is subject to maintenance considerations mainly due to the shock caused at the extremities of rotation when the main tuning shaft is rotated in the wrong direction. When the main tuning shaft is turned to one extremity and further rotation is attempted, misalignment occurs which is proportional to the torque applied. A large torque applied to a direct linkage mechanism will break a component thereof.

An important object of the present invention is to provide a novel fine tuning mechanism for television tuners where the fine tuning may be controlled by an operating knob concentric with the operating knob for the channel selector.

Still another object of the present invention is the provision of a novel mechanism for driving two shafts, both having parallel axis.

Still another object of the present invention is the provision of a simple tuning assembly for television tuners.

Still another object of the present invention is the provision of a fine tuning mechanism that permissibly slips when rotated beyond fixed limits.

Still another object of the present invention is the provision of a fine tuning mechanism which turns through a lesser angle than the fine tuning knob.

Still another object of the present invention is the provision of a novel symmetrically balanced detent mechanism for driving the main tuning shaft.

Still another important object of the present invention is the elimination of any side thrust or distortion of the main driving shaft which may cause misalignment or improper operation of the main selector elements.

Still another important object of the present invention is the provision of a novel detent mechanism that releasably fixes various angular positions of the main tuner shaft without imposing any side thrust thereon, however, imposing longitudinal or axial thrust to maintain the shaft in proper longitudinal position for cooperation with other elements of the tuner.

The novel features that are considered characteristic of this invention are set forth in the appended claims. The invention, however, both as to its organization and method of operation, as well as additional objects and advantages thereof, will best be understood from the following description when read in conjunction with the drawings, in which:

Figures 1, 3, 6:
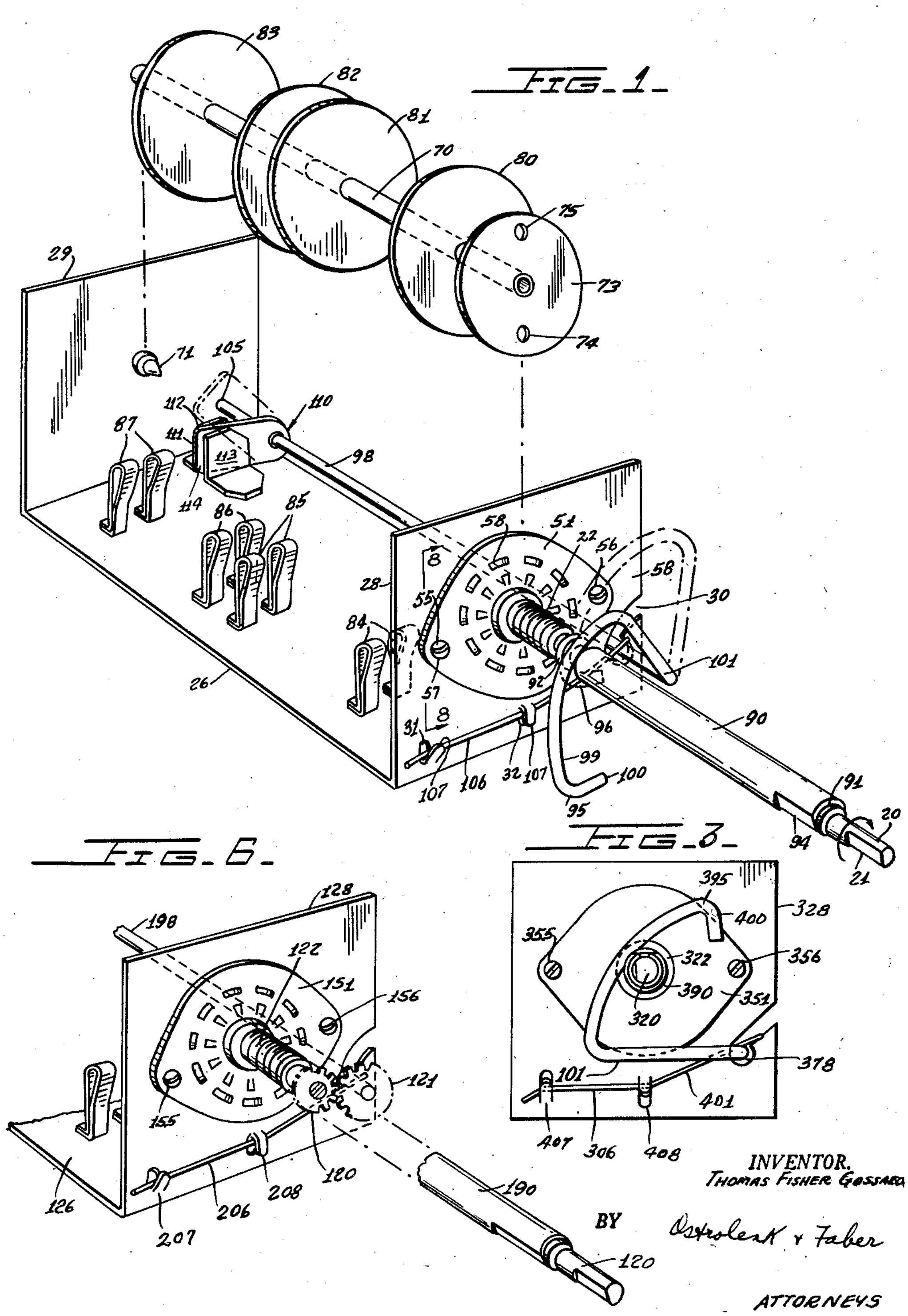
Figure 1 is a partially exploded view of a modification of my novel tuner.
Figure 3 is a front view of the tuner of my invention.
Figure 6 is a view in perspective of another modification of my present invention.

Referring now to Figure 1, shaft 20 is the main tuning shaft having a milled surface 21 provided to seat a knob which is not shown.

Figures 2, 4, 5, 7, 8, 9:
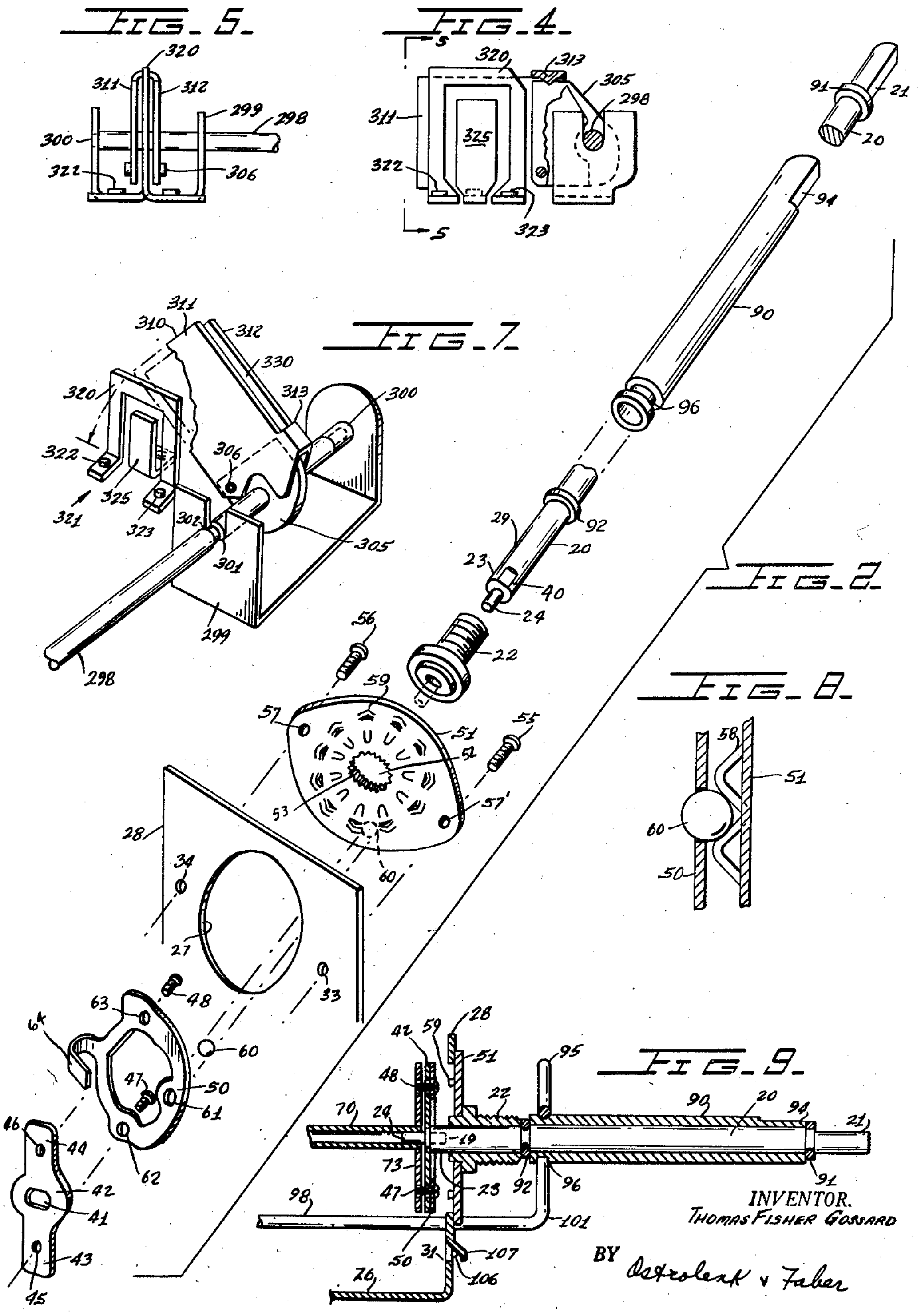
Figure 2 is an exploded view of a portion of my novel tuner.
Figure 4 is an elevation of a portion of the fine tuning element of my present invention.
Figure 5 is an end view along line 5—5 of Figure 4.
Figure 7 is a view in perspective of the fine tuning element of my present invention.
Figure 8 is a sectional view of a portion of a mechanism taken on line 8—8 of Figure 1.
Figure 9 is a sectional view of a modification of my present invention.

Shaft 20 as shown more particularly in the exploded view of Figure 2 and the sectional view of Figure 9 is a cylindrical shaft which fits through an externally threaded bushing 22 and is pinned in hole 19 of the interior extremity 23 by a pin 24. The pin 24 is a brass pin which is tight fitted into the extremity 23 to aid in positioning the main tuning elements, as is hereinafter described.

The chassis of the tuner consists of a stamped steel sheet 26 which has been bent to form part of a rectangular box as shown in Figure 1. The chassis 26 has a front panel 28 and a back panel 29, the two panels being substantially parallel to each other. On chassis 26 is mounted in any suitable way an insulating base such as disclosed in co-pending application Serial No. 261,398, filed December 13, 1951.

The front panel 28, as seen with reference to Figure 2, has opening 27, 33, 34 and three additional apertures 30, 31 and 32, as seen in Figure 1, and are hereinafter described in reference to said figure.

The opening 27 is a circular opening through the center of which passes the extremity 23 of cylindrical shaft 22 bearing a portion of pin 24 described above.

The extremity 23 of shaft 22 has two milled surfaces 40 which fit tightly into the opening 41 of crank 42. The opening 41 of crank 42 is a rectangularized opening with two rounded sides, so shaped to snugly seat the extremity 23.

The crank 42 has two arms 43 and 44 diametrically opposed.

The arms 43 and 44 have threaded holes 45 and 46, respectively. The holes 45 and 46 seat small brass screws 47 and 48, respectively, firmly attaching a partially circular member 50 to the crank 42, shown in Figures 1 and 9.

The circular member 50 is rotatably held against a seating member 51 as shown in the exploded view of Figure 2. The seating member 51 has a hole 52 with a plurality of teeth 53 for firmly seating the bushing 22. The seating member 51 is rigidly attached to the front 28 of the chassis 26 by means of two screws 55 and 56 shown in Figures 1 and 2. The screws 55 and 56 pass through the openings 57 and 57′ of the seating member 51 and thread the openings 34 and 33, respectively, of the front panel 28 of the chassis 26 described above.

The seating member 51 has a plurality of indentations 58 in the rear surface meeting bumps 59. These bumps 59 position between them a small steel ball 60 shown more particularly in Figure 8. This steel ball 60 partially fits through an opening 61 in the partially circular member 50 described above which is rigidly attached to the crank 42 by means of the screws 47 and 48 passing through the openings 62 and 63 in the partially circular member 50 to the threaded openings 45 and 46 of the crank 42, as described above. The member 50 has an elbow 64 for engaging a circular disc 73 and balancing the member 50 against the misaligning tendency due to the action of the steel ball 60.

Thus, when the knob, not shown, which is positioned on the milled portion 21 of shaft 20 is rotated, the shaft 20 rotates, causing the pin 24, which is firmly seated therein, to rotate. The pin 24 is force fit into the end of shaft 20 causing the shaft 20 to fit snugly into the crank 42. Since the crank 42 is firmly attached to the partially circular member 50, partially circular member 50 rotates. The rotation of the partially circular member 50 causes ball 60 to move from between two of the bumps 50 to the next position between the next adjacent bumps 59. The ball 60 can ride over the bump 59 due to the fact that the partially circular member 50 is a flexible member so that the rotation of the shaft 20 causes the ball 60 to ride up and over the bump 59, causing the mechanism to audibly click when the ball is seated in the next space between the bumps 59. Each click denotes the transfer from one channel to the next of the thirteen channels of the television band. Since there are twelve bumps 59 and thus twelve spaces between them, each space denotes another channel.

The pin 24 helps support a partially hollow shaft 70. The shaft 70 is suspended between one support, the pin 24 on the front panel 28 and upon a bearing pin 71, as shown in Figure 1, on the back panel 29. The shaft 70 has firmly attached to the front thereof a circular disk 73. The disc 73 is removably mounted through openings 75 and 74 by springs, not shown, to take up the tolerances in dimensions. Thus the disk 73 is removably attached to the crank 42 and the partially circular member 50 so that upon rotation of the shaft 20 the crank 42, the partially circular member 50, the disc 73 and the shaft 70 all rotate together. The shaft 70 also carries four tuning inductors 80, 81, 82 and 83. The tuning inductors 80, 81, 82 and 83 bear against spring contacts 84, 85, 86 and 87 as shown in Figure 1.

The rotation of shaft 20 by means of a knob, not shown, causes the tuning inductors 80 through 83 to rotate, changing the frequency that the tuner passes.

The shaft 20 carries a hollow shaft 90 positioned between two clips 91 and 92, as seen in Figures 1 and 2. The shaft 90 is rotatably mounted upon the shaft 20 and has a milled portion 94 at its front end for seating another knob, also not shown. This shaft 90 is the fine tuning shaft and frictionally moves a crank 95 which bears against a groove 96 on the hollow shaft 90. The crank 95 is a continuation of a shaft 98 about which it rotates.

The crank 95 has a bearing surface 99 which is shaped in the form of an arc of a circle. The arc in the present embodiment covers approximately 75° of a circle. The rotation of the shaft 98 is limited in one direction by means of a stop 100, which is an integral part of the crank 95 and at the other end by means of another integral part of the crank 95, which is the connection 101 between the shaft 98 and the crank 95. Further rotation of the shaft 90 can be accomplished but will result only in the slipping of the crank 95 in the groove 96, causing no further rotation of the shaft 98. The shaft 98 passes through the opening 30 which is in the front panel 28 described above and also through another opening 105 in the back panel 29. The shaft 98 is then supported in three places, in the opening 105, in the opening 30 and against the groove 96.

A spring member 106 bears against the shaft 98 forcing it into the opening 30. This spring member 106 is positioned in place by means of the openings 31 and 32 described above and their associated positioning arms 107 and 108. The shaft 98 bears in this modification an approximately rectangular member 110 shown in Figure 1, rigidly attached thereto. This substantially rectangular member 110 serves as the dielectric for the variable condenser 111.

The variable condenser 111 comprises two metallic plates 112 and 113 which are rigidly positioned in relation to the chassis 26. The plates 112 and 113 have a space 114 therebetween. The space 114 allows the dielectric member 110 to be inserted upon the rotation of the shaft 98. The fine tuning is then accomplished by rotating the shaft 90, causing the crank 95 to rotate. The rotation of crank 95 causes the shaft 98 and the dielectric 110 to rotate, inserting various amounts of dielectric between the plates 112 and 113 of the variable condenser 111.

The principles utilized in the above construction are applicable to a variety of modifications.

The tuning may be desired to be made very fine so that a fairly large rotation of the fine tuning shaft will cause the required change in capacitance of the variable capacitor. This may be accomplished by making the crank 95 longer, if necessary almost to a 360° arc and varying the shape of the dielectric so that the dielectric is inserted into the space between the plates of the variable capacitor in a gradual manner as the tuning shaft is rotated.

The modification as shown in Figure 1 has the two shafts 90 and 98 rotating in substantially the same direction. The rotation of shaft 98 may be achieved, as shown in Figure 3, with the crank arm 101 being below the shafts 320 and 390 instead of above, as discussed with reference to Figure 1.

In another modification as shown in Figure 6, the gear 120 meshes with the gear 121 causing the gear 121 to rotate in an opposite direction as the shaft 190. The gear 121 is rigidly attached to a shaft 198 which bears the fine tuning variable capacitor, as described above. The shaft 198 is positioned against the front panel 128 by means of a spring member 206 which is positioned against stops 207 and 208.

This embodiment of my present invention allows for variety of ratios of rotation between the shafts 190 and 198 allowing finer or rougher tuning by causing smaller or greater rotation of the dielectric member of the variable capacitor as described above.

Figures 11, 12, 13:
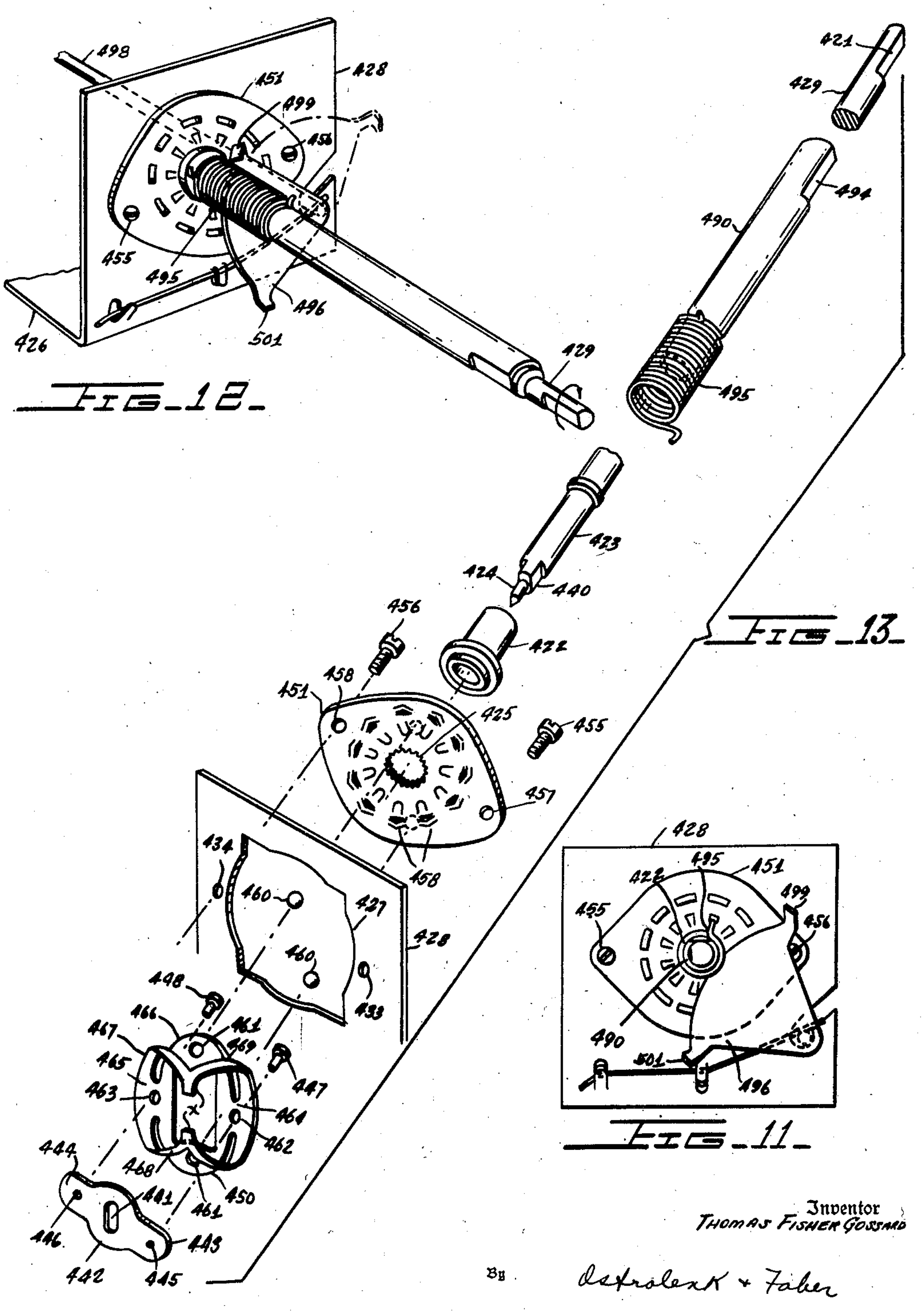
Figure 11 is a front view of a modification of my present invention.
Figure 12 is a view in perspective of a modification of my present invention.
Figure 13 is an exploded view of a modification of my present invention.

In the modification of the present invention as shown in Figures 11, 12 and 13, the base 426 has a front panel 428. The front panel 428 supports the notched member 451 by means of two screws 455 and 456 over the opening 427. The screws 455 and 456 fit through the holes 457 and 458 in the notched member 451 and thread the holes 433 and 434 in the front panel 428. The notched member 451 has a centrally located multi-toothed opening 425, which opening 425 seats a brass bushing 422.

The bushing 422 rotatably supports a shaft 429. The shaft 429 is the main tuning or channel selector shaft and has a milled portion 421. The milled portion 421 supports a knob, not shown. The shaft 429 also supports a hollow fine tuning shaft 490 hereinafter described.

The end 423 of the shaft 429 has two diametrically opposed milled faces 440 and a pin 424 as an integral part thereof. The end 423 protrudes from the bushing 422 and fits into the opening 441 of crank member 442. The crank member 442 has diametrically opposed arms 443 and 444. The arms 443 and 444 have holes 445 and 446 respectively.

The crank member 442 is riveted by means of rivets 447 and 448 through openings 445 and 446 to a resilient rotatable member 450. The resilient member 450 bears the rivets 447 and 448 in openings 462 and 463 respectively.

The openings 462 and 463 are located in the junctions 464 and 465 which join the two units 466 and 467 of the resilient member 450. The unit 466 is elliptically shaped and has two diametrically opposed openings 461. The opening 461 seats ball bearings 460 against the notched member 451. The diameter of the opening 461 is slightly smaller than the diameter of the bearings 460. The bearings 460 are seated between the rounded notches 458.

The rotation of shaft 429 causes the crank 442 bearing resilient member 450 to rotate. The rotation of the resilient member 450 causes the bearings 460 to ride over the notches 458 to a subsequent position between two notches 458.

Figure 14:
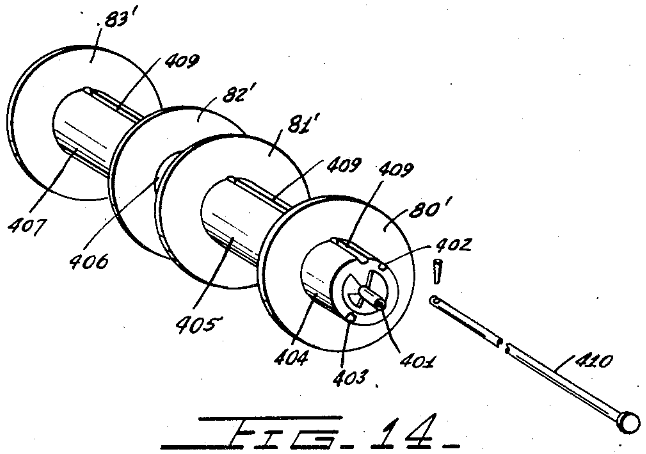
Figure 14 is a view in perspective of a modification of the main tuning unit of the present invention.

The other unit 467 of resilient member 450 is also elliptically shaped and is bent at 468 and 469 to resiliently drive a cylindrical member 400 as shown in Figure 14.

The spring member 450 provides a symmetrically balanced detent mechanism in which the required spring force or tension is evenly divided and so eliminates any side thrust or distortion of the main driving shaft 401.

The spring member 450 also provides the thrust force which force is required to hold the tunable element of coil boards 83′, 82′, 81′ and 80′ similar to the coil boards 83—80 described above against the pivot point as 71, described above. The member 450 has a third function by providing the turning force or torque required to turn the movable tuning elements. This action is accomplished through the two fingers or protrusions X (Figure 13). The fingers X provide spring tension in the direction of the main drive shaft 401 being supported by the two bent supporting portions 469 and 468 of the spring member 450.

The advantages of this type of construction is that one unit or stamping for the part 450 essentially serves as two or three more separate springs, levers or members necessary to accomplish the functions of positioning the tuning element in the chassis, of providing the turning moment for the tuning element, and of providing for adequately detenting or stopping the tuning element in accurately controlled position or positions.

The main tuning element or drum consisting of the printed coils 80′—83′ is supported between pivots and the driving moment is provided by the two points X of the spring 450.

Any slight misalignment of the sometimes long tuning shaft 429 will not throw any distortion or strain on the main tuning assembly. The distortion or strain is taken up by the spring action of member 450 which the fingers X then move in the corresponding slots 402 and 403 in member 404 hereinafter described.

The pin 424 described above helps support the partially hollow shaft 401. The shaft 401 is suspended between one support, the pin 424 on the front panel 428 and upon a bearing pin on the back panel similar to 71 Figure 1. The shaft 401 has firmly attached to the front thereof a cylindrical member 404. The member 404 is removably attached to the resilient member 450 at points X described above so that upon rotation of the shaft 429 the crank 442, the resilient member 450, the member 404 and the shaft 401 all rotate together. The shaft 401 also carries four tuning inductors or printed coils 80′ through 83′ described above.

The rotation of shaft 429 as described above by means of a knob, not shown, causes the tuning inductors 80′ through 83′ to rotate, changing the tuned frequency to which the set is tuned.

The coil boards 80′ through 83′ are rigidly fixed in position by the plastic bushings 404 through 407 and an end bushing (not shown) which slide on the shaft 401. These bushings each have a longitudinal groove 409 through which a plastic rod 410 fits. The rod 410 passes through holes in the inductors 80′—83′ maintaining them rigidly in position.

The shaft 429 supports a hollow shaft 490. The hollow shaft 490 is milled at one end 494 to support a knob, not shown.

At the other end 492 of the hollow shaft 490 is rigidly attached a coil spring 495. The spring 495 may be fixed to the shaft 490 by brazing or by threading it on tightly or by any other means known in the art. The spring 495 is in frictional relationship with a resilient member 497. The resilient member 497 is shaped as the sector of a circle and has two extensions 499 and 501. The member 497 is rigidly supported on a shaft 498 either by a welded connection or otherwise.

The rotation of the hollow shaft 490 causes the rotation of the resilient shaped member 497 and thus the shaft 498.

The contact between the spring 495 and the resilient member 497 is a high frictional one. The resilient member 497 is deformed against the spring 495. The contact arcuate edge 500 of the member 497 bears tangentially against two surfaces of the spring 495 as it fits into the space between the coils of the spring 495. The construction results in a substantially positive drive with negligible slippage.

The extensions 499 and 501 come into contact with the spring 495 and prevent further rotation of the resilient member 497. Further rotation of the hollow shaft 490 causes slippage between the resilient member 497 and the coil spring 495.

The shaft 498 performs the fine tuning in a similar manner as either shaft 98 in Figure 1 or shaft 298 in Figure 7.

Figures 4, 5 and 7 show an embodiment of my invention where the variable condenser is rotated on a shaft 298. The shaft 298 is positioned in a frame 299 by means of a hole 300 at one end of the frame 299 and a slot 301 at the other end of the frame 299. The shaft 298 has a groove 302 which fits into the slot 301. The shaft 298 has rigidly attached thereto a partially circular path occurrence of insulating member 305. The partially circular dielectric member 305 has rigidly attached thereto by means of a rivet 306 a plate assembly 310. The plate assembly 310 is thus insulated from the shaft 298. This insulation is provided to eliminate sliding contacts wherever possible since sliding metallic contacts contribute appreciably to the noise during the operation of a fine tuner.

The plate assembly 310 comprises two metallic plates 311 and 312 which are connected by means of a connection 313, all of which are integral parts of the plate assembly 310.

The rotation of shaft 298 by means of various methods described above in reference to Figures 1 to 6 and 9 cause the dielectric member 305 and the plate assembly 310 to rotate. The rotation of the plate assembly 310 causes the plate assembly 310 to rotate over a U-shaped conductor 320 which is rigidly attached to the base 321 by means of two rivets 322 and 323. The plate assembly 310 also rotates over a substantially rectangular member 325 which is seated centrally in the opening of the U-shaped member 320.

The rectangular plate 325 lies substantially in the same plane as the space 330 which is between the two plates 311 and 312 and also in the same plane as the U-shaped member 320. The U-shaped member 320 and the rectangular plate 325 are essentially of the same thickness and preferably of the same conducting material having approximately a 1/16 of an inch rectangular gap between the rectangular member 325 and the U-shaped member 320. The central rectangular plate 325 is connected to the base 321 of the tuner. The rotation, then, of the plate assembly 310 increases the capacity between the U-shaped member 320 and the rectangular member 325. The increasing capacity is due to two series capacitors, one from the U-shaped member 320 to the plates 311 and 312 and the other from the movable plates 311 and 312 to the rectangular plate 325.

The reason for the above construction is to provide an approximately equal fine tuning range on the high frequency channels and the low frequency channels. Since the high frequency band is approximately two to three times the frequency of the low frequency bank, the percentage change of frequency when capacitance change alone is used for fine tuning is substantially constant. Thus an equal rotation of the fine tuner fine tuning knob will cause a greater variation in frequency at the upper band than on the lower band.

Figure 10:
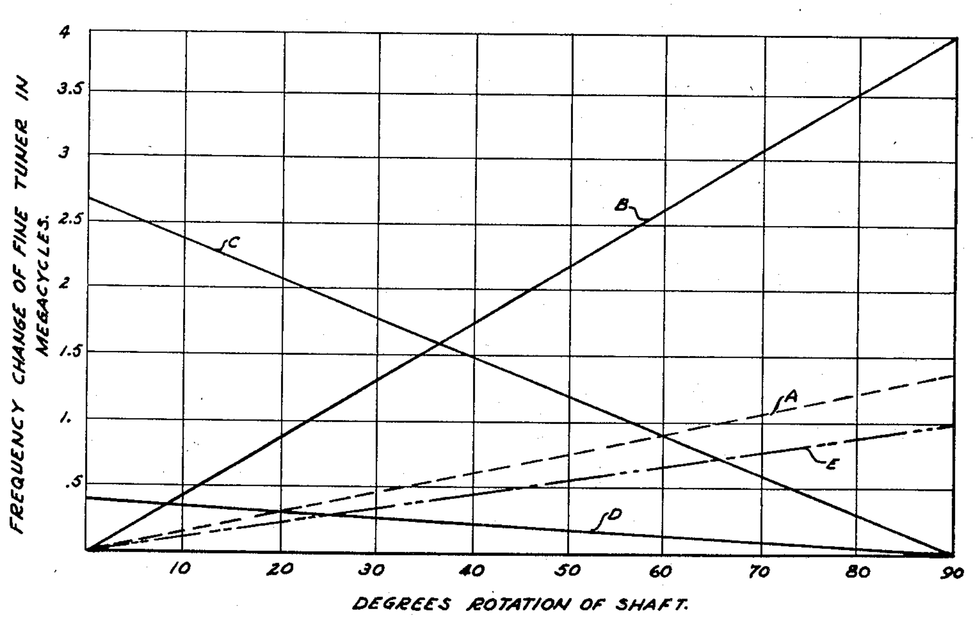
Figure 10 is a series of reactance vs. shaft rotation curves.

When operating on the high frequency band, then, the fine tuning tends to become rougher, giving greater variations and making it harder to tune accurately. The construction as shown in Figures 4, 5 and 7 alleviates this condition by introducing a variation in inductive reactance in the U-shaped member 320 due to eddy currents in plate assembly 310. The variation in inductive reactance on the low channels as illustrated in Figure 10 on the curve marked D is practically negligible as the shaft is rotated. The variation in inductive effect, however, on the high channels, as illustrated by the curve marked C is substantial and the frequency change produced by this variation is correspondingly large. This frequency change produced by variation in inductive reactance is in opposition to the frequency change produced by the simultaneous change in capacitance.

The tuning range on the low channels is shown by the dashed curve A. Curve A is the approximate curve which is the desirable tuning range on the high channels. The tuning range of the capacitor alone on the high channels is illustrated by the curve B. Combining the effects of curve B, the tuning range of the capacitor alone on the high channels, together with the inductive effect on the high channels, curve C produces a resultant tuning range on the high channels as illustrated by curve E. Thus if the high frequency was, say, three times as great as the low frequency, an equivalent inductive reactance, which would be approximately two-thirds the capacitive reactance, would be introduced at this high frequency, leaving an equivalent capacity of one-third the capacitor resulting in a tuning range which is susbtantially the same as on the low frequency. The result of this construction is a fine tuning means which gives susbtantially the same tuning frequency range on the high band channels as on the low band channels.

While certain preferred embodiments of the invention have been specifically disclosed, it is understood that the invention is not limited thereto, as many variations will be readily apparent to those skilled in the art and the invention is to be given its broadest possible interpretation within the terms of the following claims.

I claim:

1. In a fine tuning mechanism utilizing a control sleeve and a remote tunable element; an integral member having a straight portion arranged parallel to the sleeve and secured to the element for rotational displacement thereof, an arcuate integral extension in a plane substantially perpendicular to said straight portion and an arm integral with and connecting said straight portion and said arcuate extension to position the extension into frictional rotational coaction with the sleeve, and a re-entrant tip on said arcuate extension for stopping its excursion beyond a predetermined amount, said arm limiting the excursion at the opposite extension end.

2. In a mechanism as set forth in claim 1, further incorporating a spring supported on the mechanism and pressed against the straight portion to maintain the arcuate portion in continuous frictional engagement with the sleeve.

References Cited in the file of this patent

UNITED STATES PATENTS

| | | |
|---|---|---|
| 2,078,637 | Naden | Apr. 27, 1937 |
| 2,288,539 | Morrison | June 30, 1942 |
| 2,341,345 | Van Billard | Feb. 8, 1944 |
| 2,395,520 | Toth | Feb. 26, 1946 |
| 2,455,326 | Bowditch | Nov. 30, 1948 |
| 2,551,228 | Achenbach | May 1, 1951 |
| 2,558,454 | Nienaber et al. | June 26, 1951 |
| 2,579,659 | Fisher | Dec. 25, 1951 |
| 2,580,895 | De Tar | Jan. 1, 1952 |